(12) United States Patent
Cho et al.

(10) Patent No.: US 11,997,914 B2
(45) Date of Patent: May 28, 2024

(54) METHOD OF MANUFACTURING ORGANIC LIGHT-EMITTING DISPLAY DEVICE

(71) Applicant: Samsung Display Co., LTD., Yongin-si (KR)

(72) Inventors: Hyun Min Cho, Hwaseong-si (KR); Shin Il Choi, Hwaseong-si (KR); Sang Gab Kim, Seoul (KR); Tae Sung Kim, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 628 days.

(21) Appl. No.: 17/255,406

(22) PCT Filed: Dec. 21, 2018

(86) PCT No.: PCT/KR2018/016441
§ 371 (c)(1),
(2) Date: Dec. 22, 2020

(87) PCT Pub. No.: WO2020/004747
PCT Pub. Date: Jan. 2, 2020

(65) Prior Publication Data
US 2021/0376243 A1    Dec. 2, 2021

(30) Foreign Application Priority Data
Jun. 25, 2018   (KR) .................. 10-2018-0072844

(51) Int. Cl.
*H01L 29/786* (2006.01)
*H10K 59/121* (2023.01)
(Continued)

(52) U.S. Cl.
CPC ....... *H10K 71/233* (2023.02); *H10K 59/1216* (2023.02); *H10K 59/124* (2023.02);
(Continued)

(58) Field of Classification Search
CPC .. H10K 71/00–861; H10K 59/12–1315; H01L 27/1259–1296
See application file for complete search history.

(56) References Cited

U.S. PATENT DOCUMENTS 9,548,324 B2   1/2017   Li et al.
10,170,502 B2  1/2019   Jeong et al.
(Continued)

FOREIGN PATENT DOCUMENTS

| | | |
|---|---|---|
| CN | 103715141 A | 4/2014 |
| CN | 107342294 A | 11/2017 |

(Continued)

OTHER PUBLICATIONS

International Search Report of PCT/KR2018/016441, dated May 20, 2019, 2 pages.
(Continued)

*Primary Examiner* — Eric A. Ward
(74) *Attorney, Agent, or Firm* — Lewis Roca Rothgerber Christie LLP

(57) ABSTRACT

A method of manufacturing an organic light-emitting display device is provided. The method includes: forming a lower electrode pattern on a substrate, which includes a transistor area and a capacitor area, to correspond to the transistor area and forming a buffer layer on the substrate including the lower electrode pattern; forming a thin-film transistor including an oxide semiconductor layer on the buffer layer; forming an interlayer insulating film on the thin-film transistor; forming a photoresist film pattern including first and second holes, which have different depths, on the interlayer insulating film; and forming a first contact hole, which exposes the lower electrode pattern, and second contact holes, which expose the oxide semiconductor layer, at the same time using the photoresist film pattern.

21 Claims, 13 Drawing Sheets

(51) Int. Cl.
  *H10K 59/124* (2023.01)
  *H10K 71/16* (2023.01)
  *H10K 71/20* (2023.01)
  *H10K 71/00* (2023.01)
  *H10K 102/00* (2023.01)

(52) U.S. Cl.
  CPC ........... *H10K 71/166* (2023.02); *H10K 71/00* (2023.02); *H10K 2102/00* (2023.02); *H10K 2102/351* (2023.02)

(56) References Cited

U.S. PATENT DOCUMENTS

| | | | |
|---|---|---|---|
| 2002/0074549 A1* | 6/2002 | Park | H01L 27/124 257/E29.147 |
| 2014/0217398 A1* | 8/2014 | Chang | H01L 29/7869 257/43 |
| 2015/0008426 A1 | 1/2015 | Cho et al. | |
| 2016/0276376 A1 | 9/2016 | Sun et al. | |
| 2017/0317104 A1 | 11/2017 | Jeong et al. | |
| 2018/0075805 A1 | 3/2018 | Kim et al. | |
| 2019/0165002 A1* | 5/2019 | Cheng | G02F 1/133512 |

FOREIGN PATENT DOCUMENTS

| | | |
|---|---|---|
| KR | 10-2001-0073791 A | 8/2001 |
| KR | 10-2007-0055384 A | 5/2007 |
| KR | 10-2013-0107648 A | 10/2013 |
| KR | 10-2015-0136363 A | 12/2015 |
| KR | 10-2017-0124151 A | 11/2017 |
| KR | 10-2018-0036853 A | 4/2018 |

OTHER PUBLICATIONS

Written Opinion of the International Searching Authority corresponding to PCT/KR2018/016441, dated May 20, 2019, 7 pages.
Chinese Office Action dated Nov. 1, 2023, issued in Chinese Patent Application No. 201880095019.5 (6 pages).

* cited by examiner

[Fig. 1]
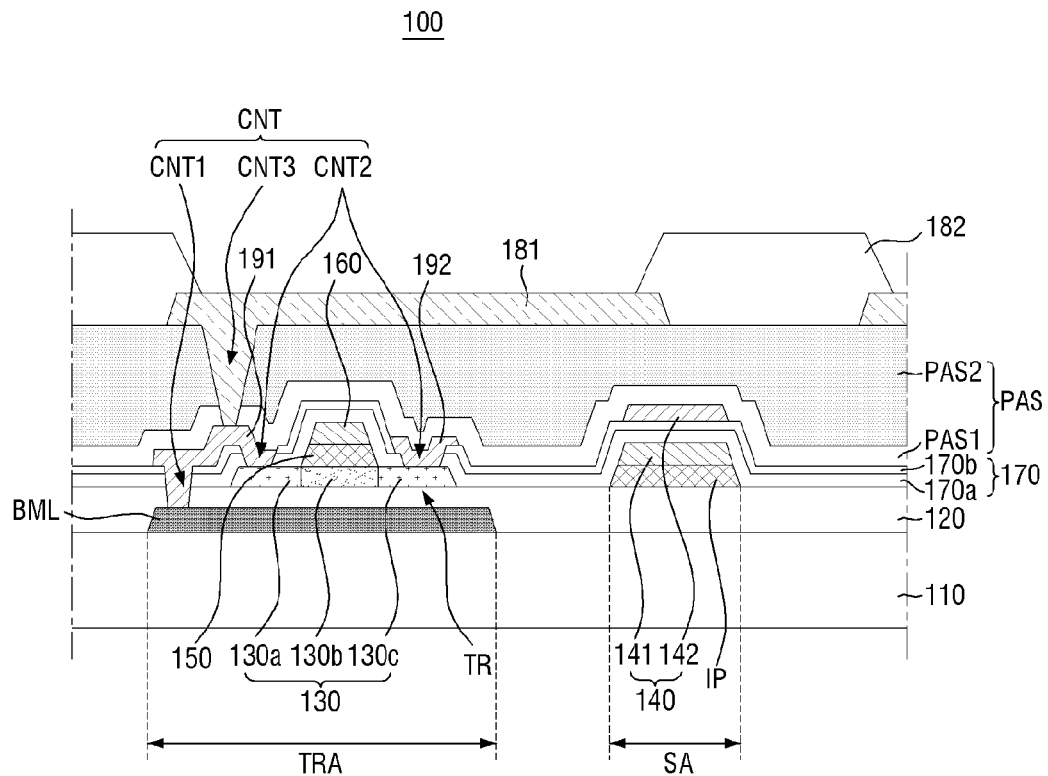
[Fig. 2]
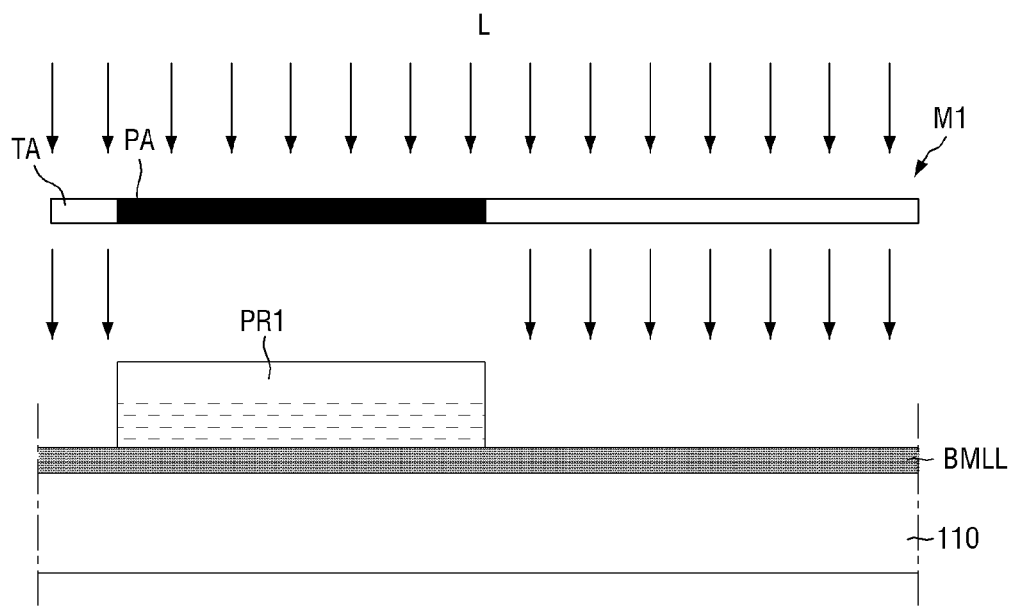

[Fig. 3]
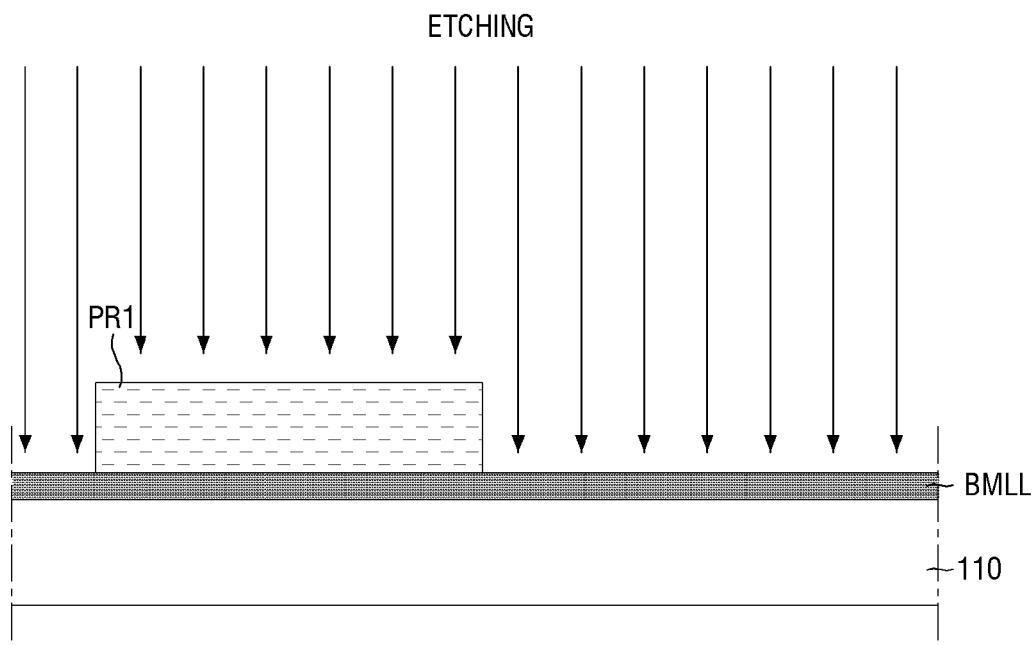
[Fig. 4]
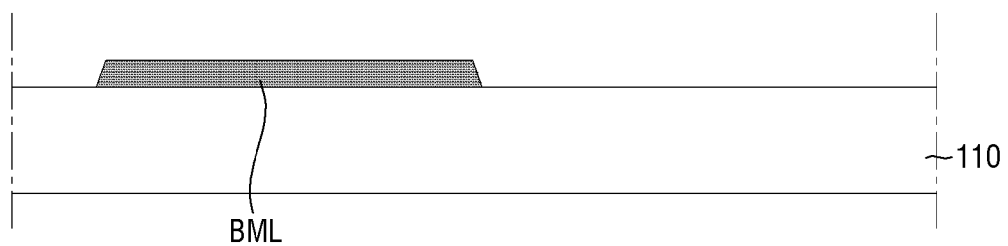
[Fig. 5]
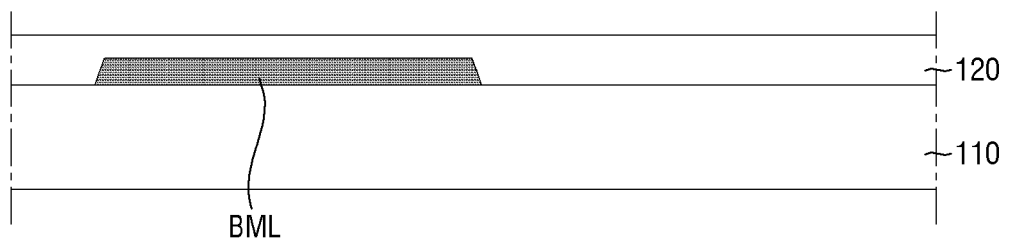

[Fig. 6]
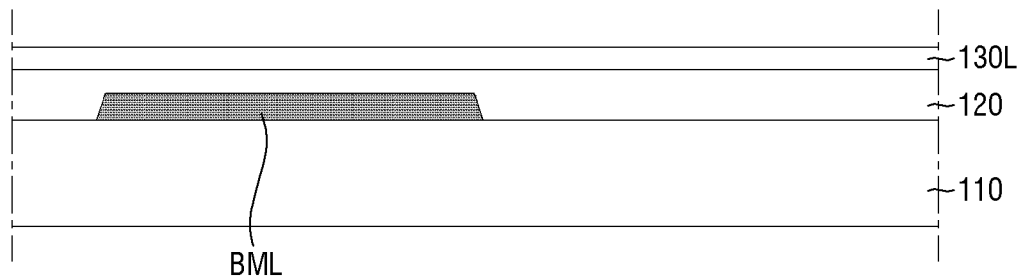
[Fig. 7]
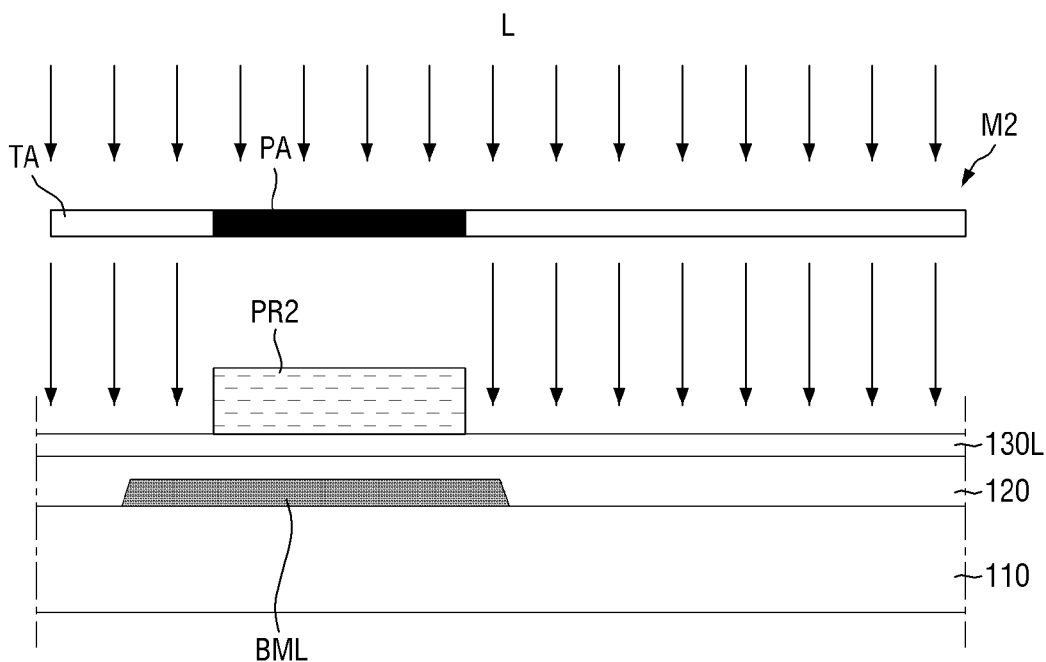

[Fig. 8]
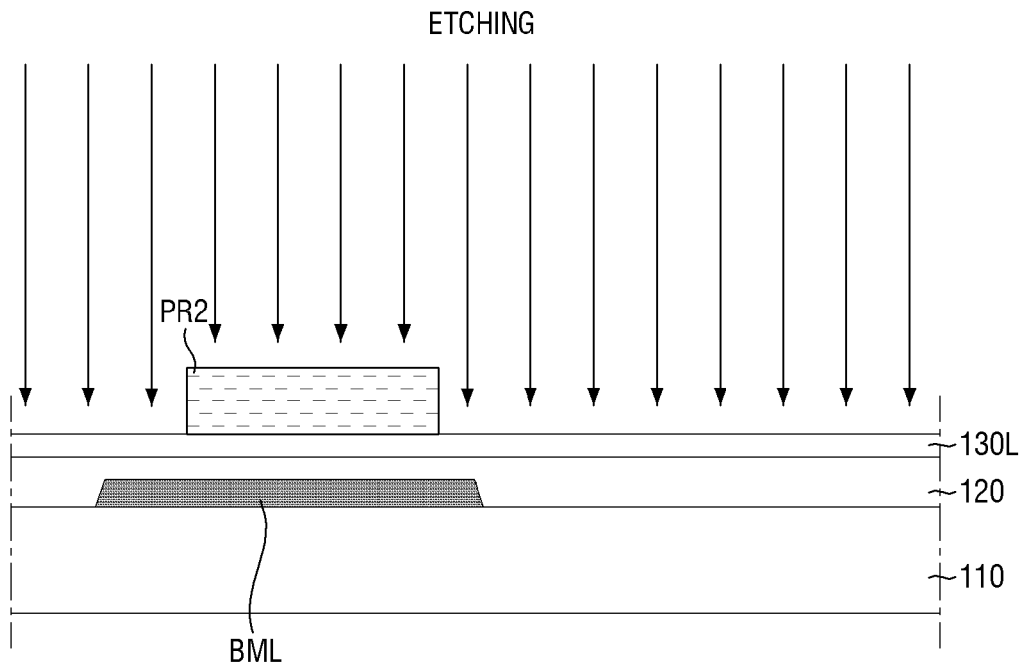
[Fig. 9]
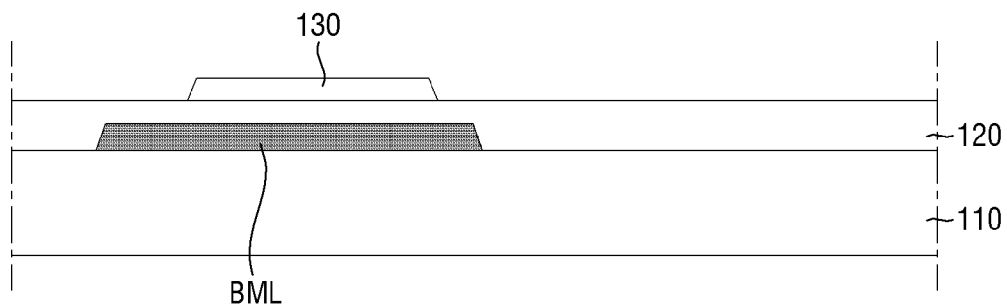
[Fig. 10]
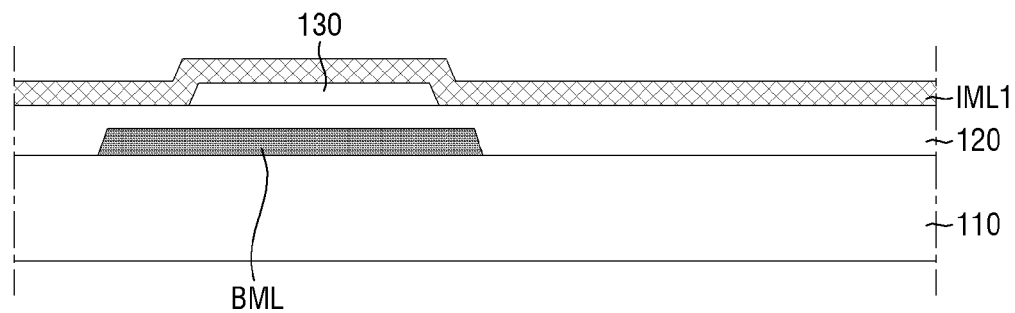

[Fig. 11]
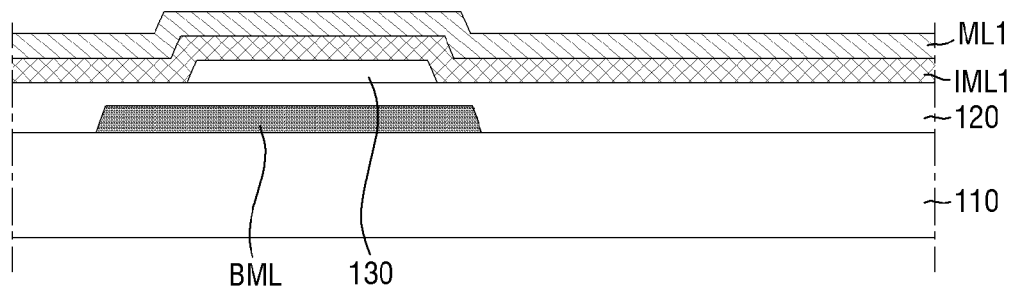
[Fig. 12]
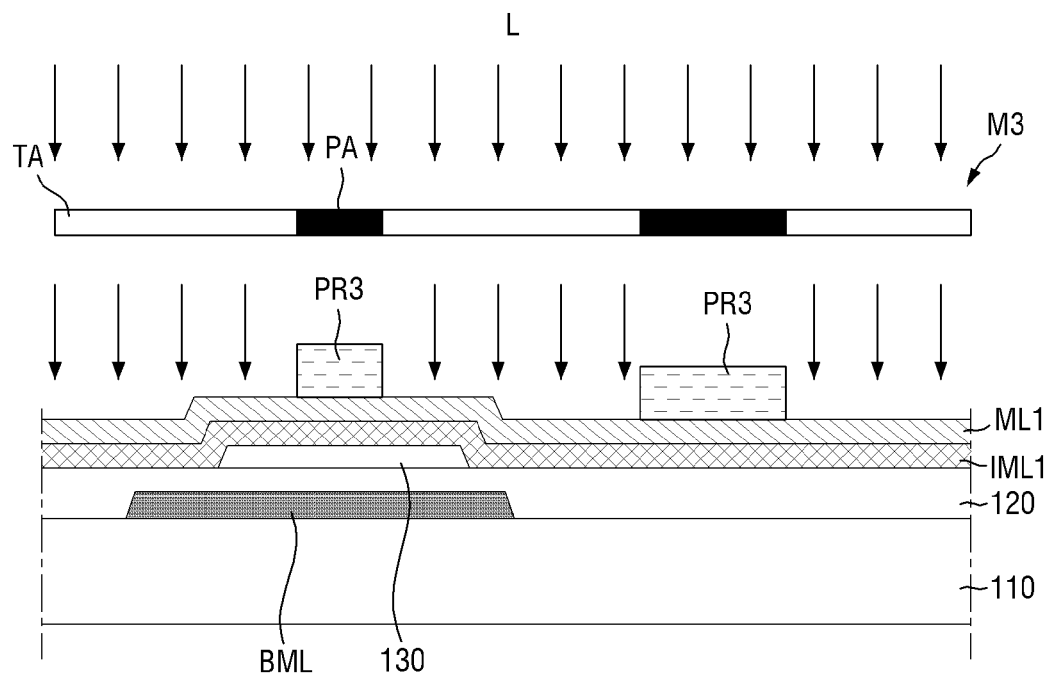

[Fig. 13]
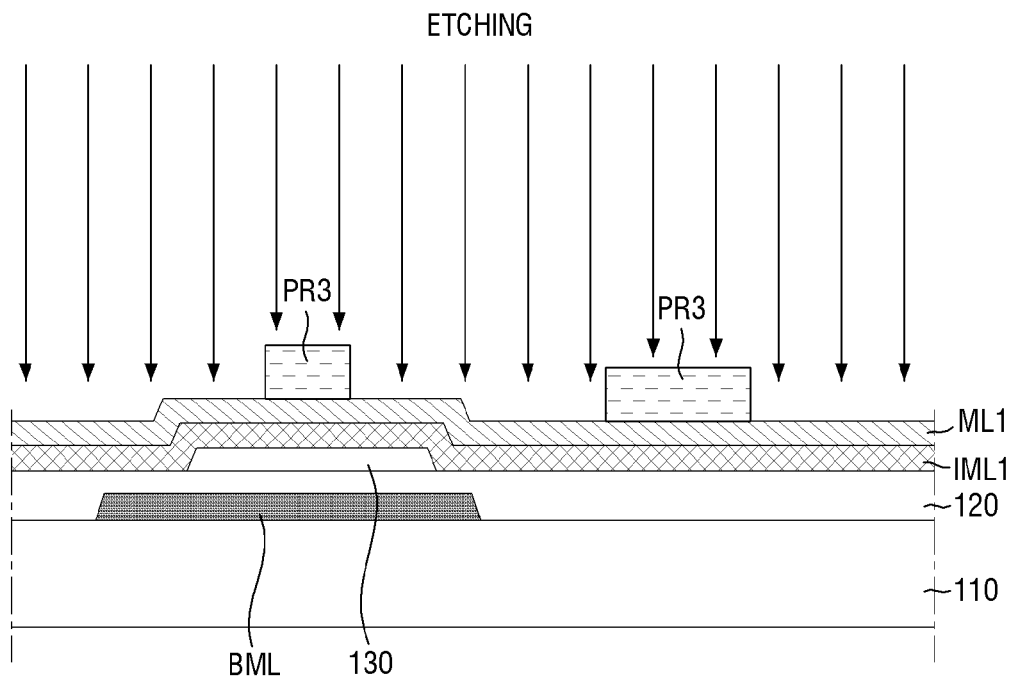
[Fig. 14]
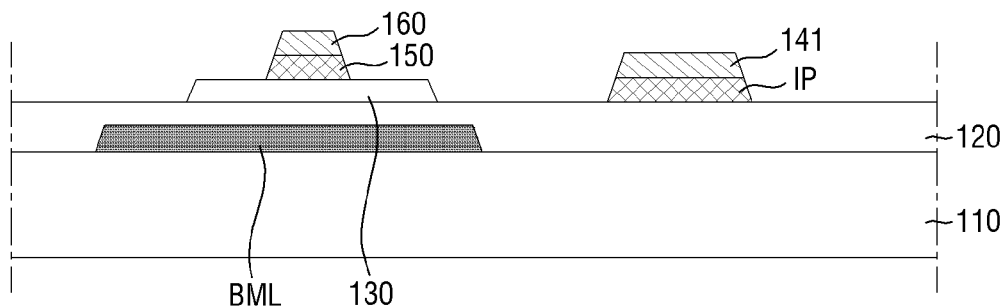
[Fig. 15]
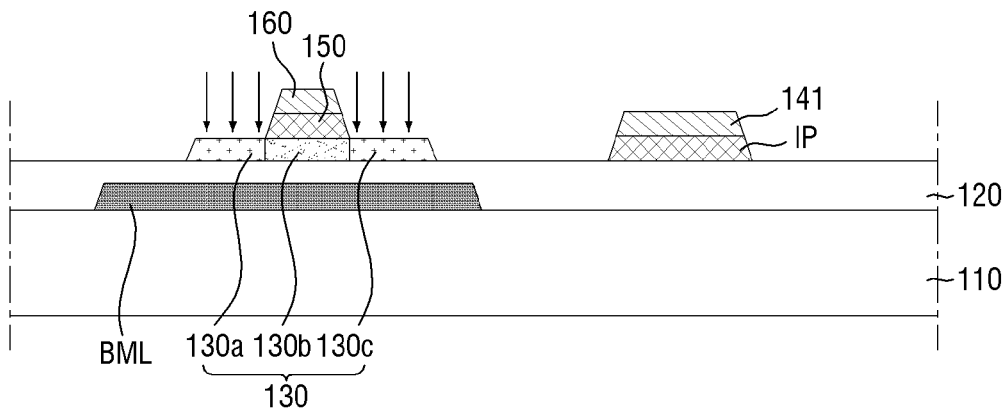

[Fig. 16]
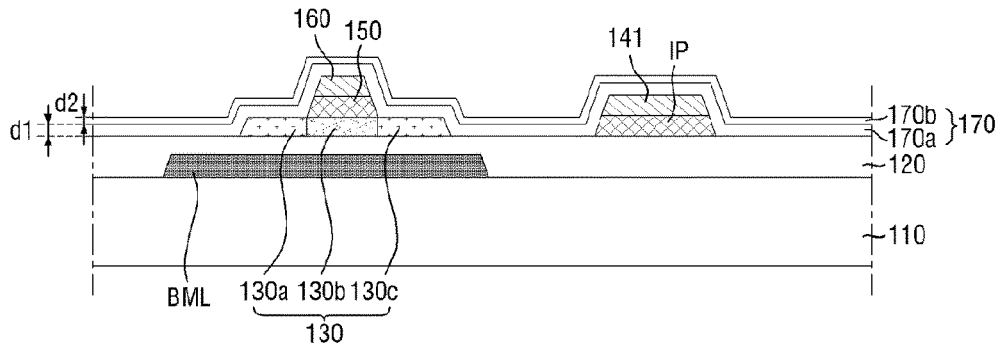
[Fig. 17]
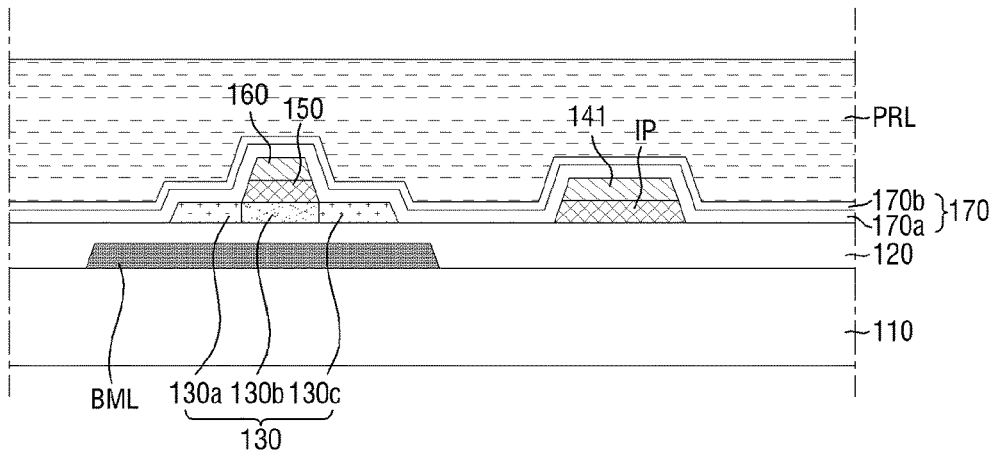
[Fig. 18]
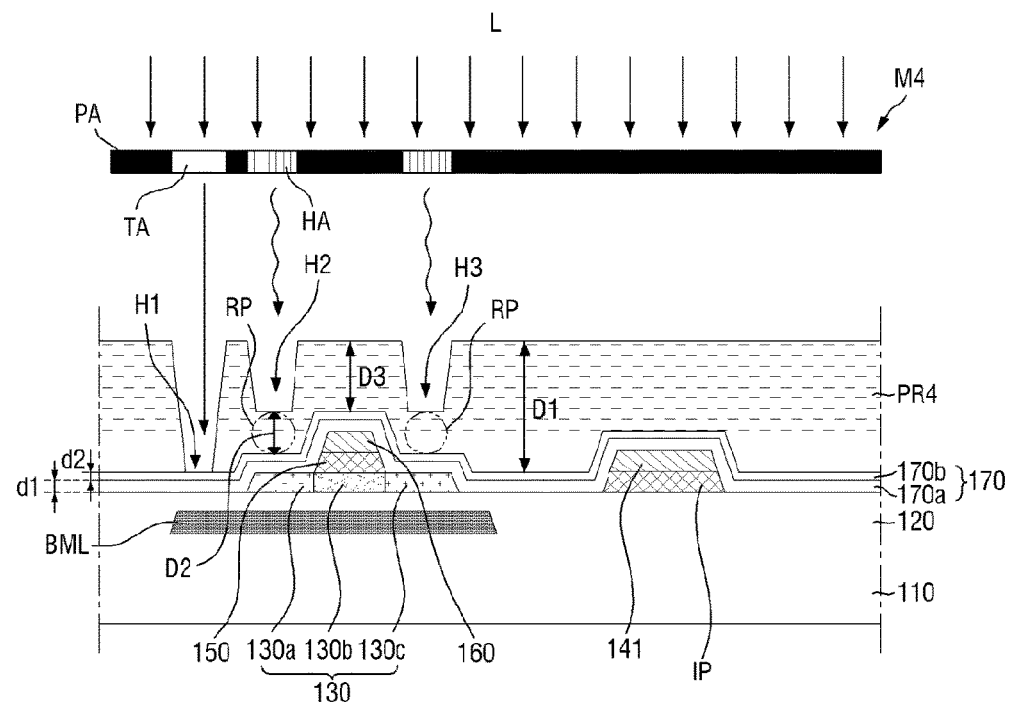

[Fig. 19]
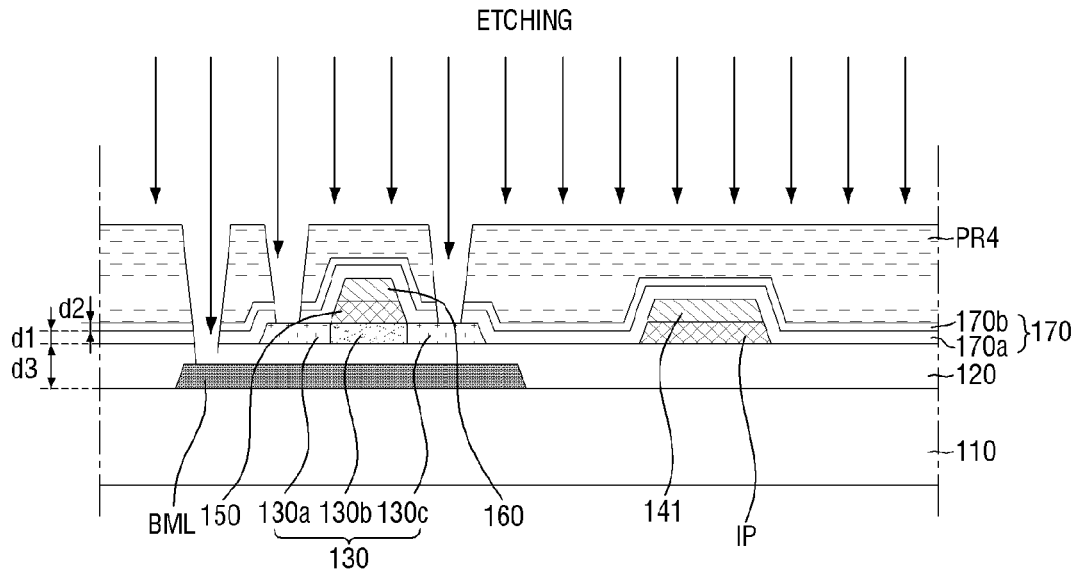
[Fig. 20]
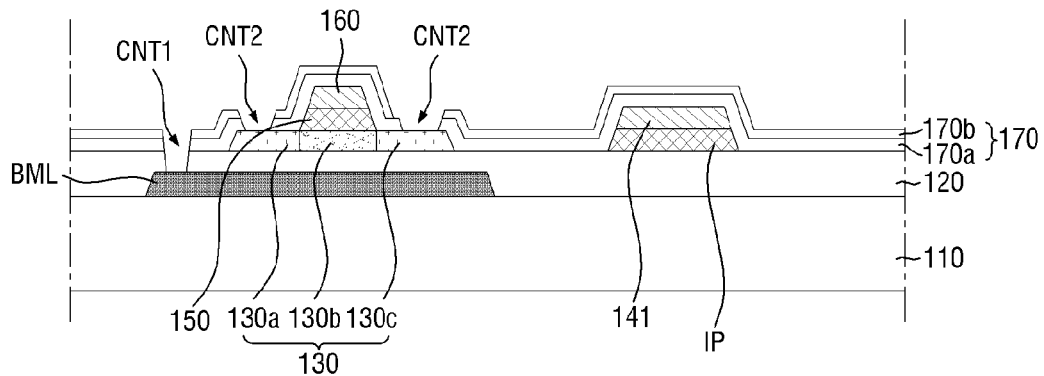
[Fig. 21]
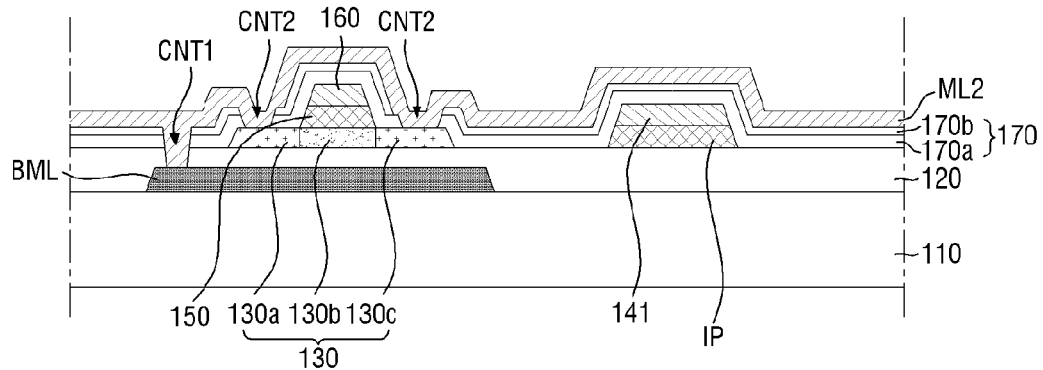

[Fig. 22]
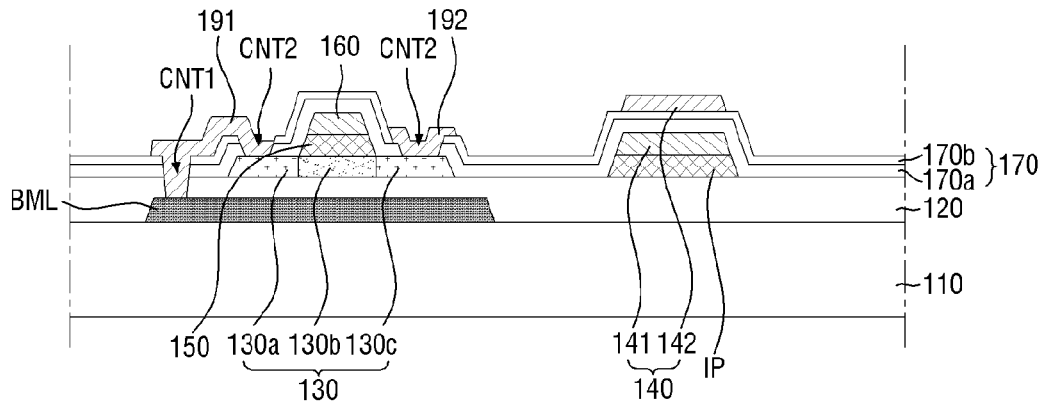
[Fig. 23]
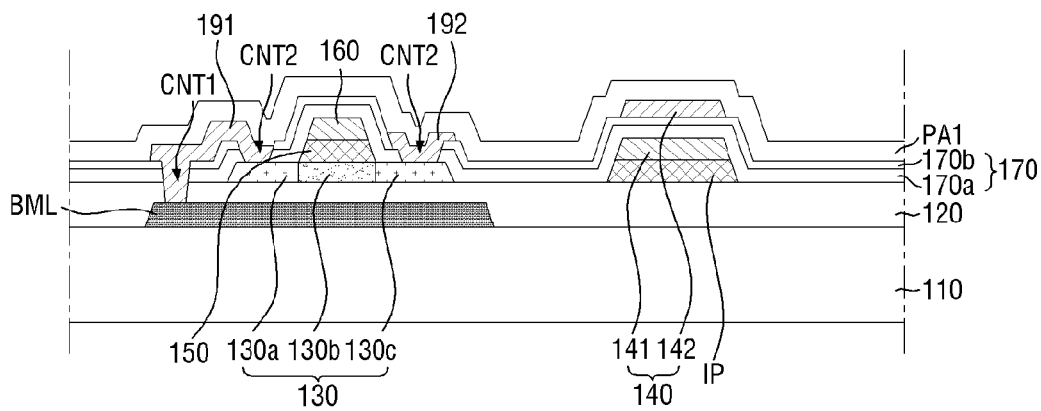
[Fig. 24]
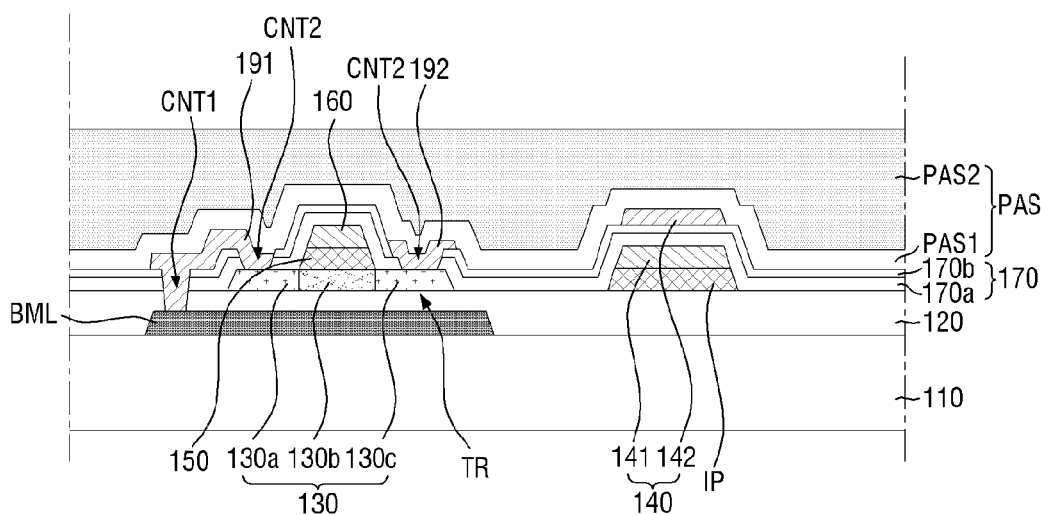

[Fig. 25]
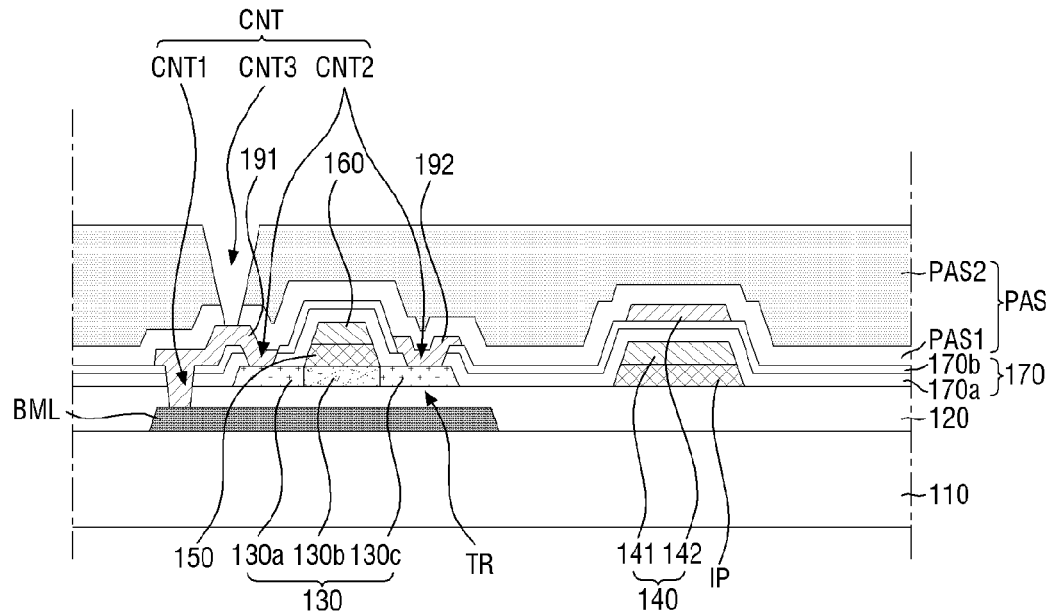
[Fig. 26]
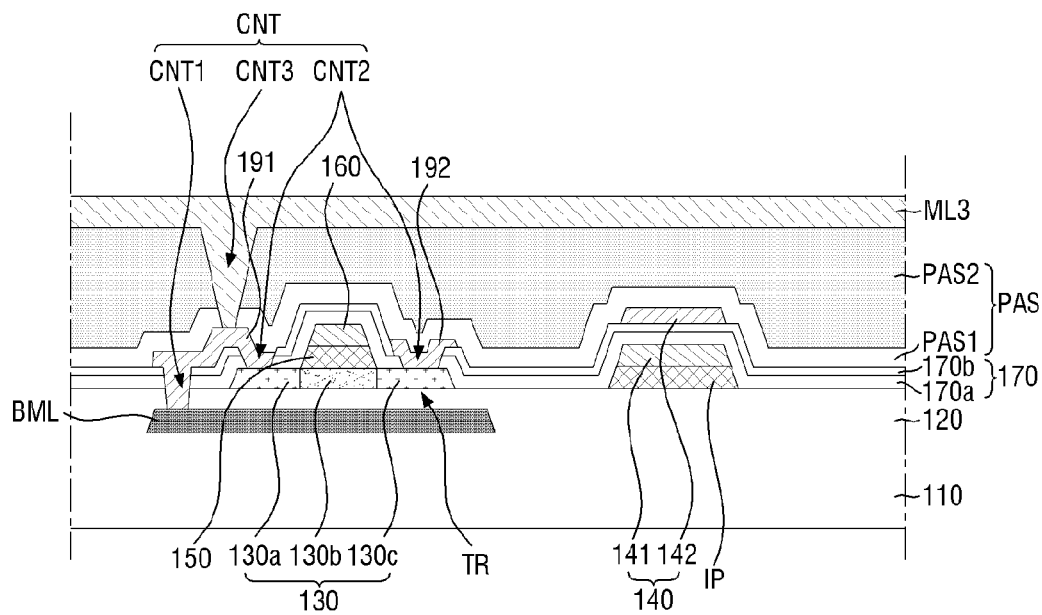

[Fig. 27]
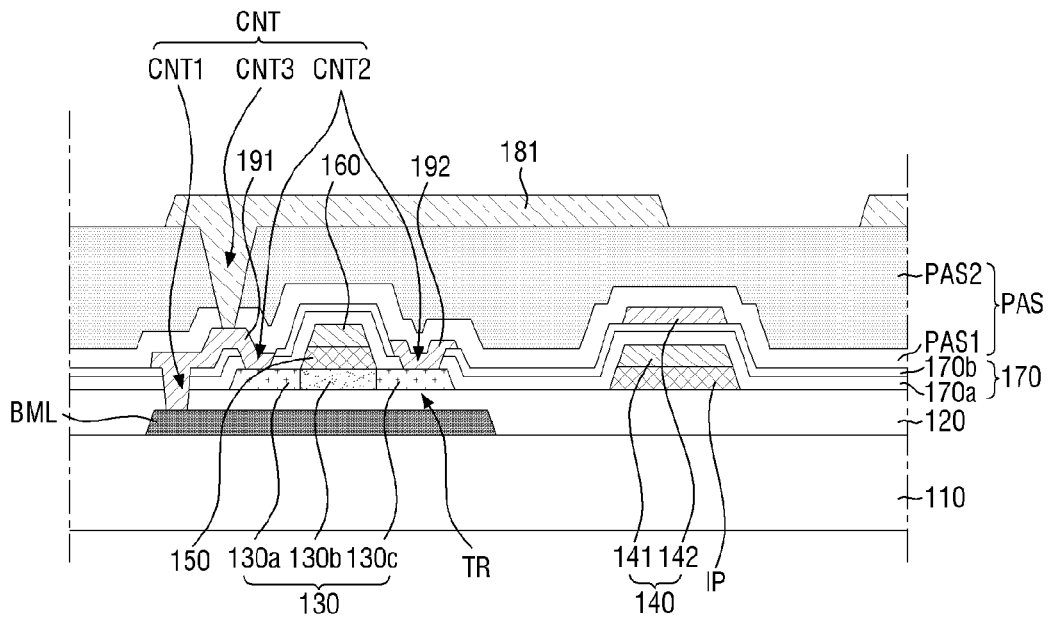
[Fig. 28]
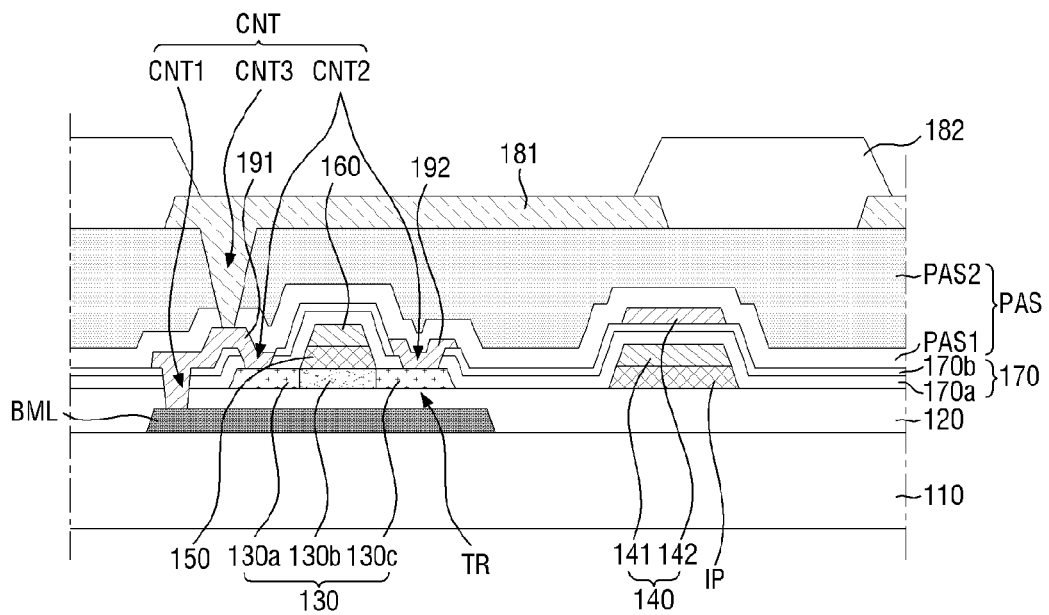

[Fig. 29]
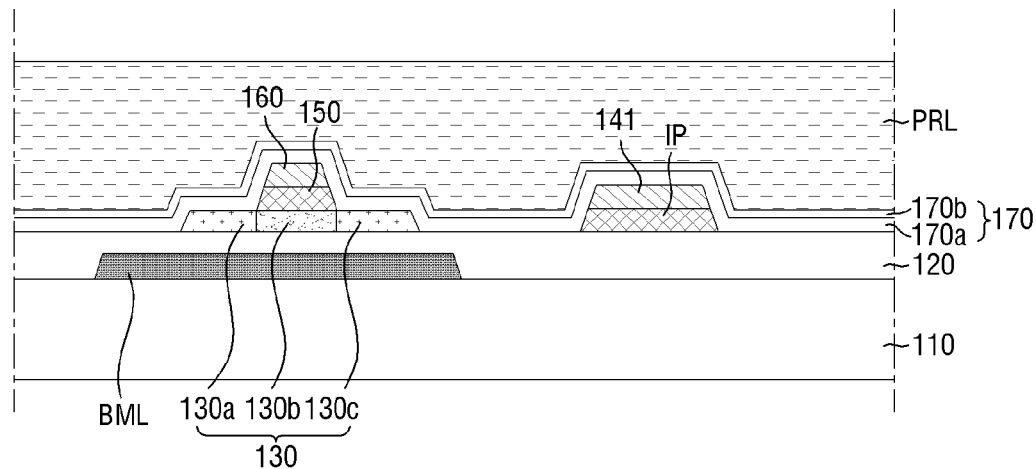
[Fig. 30]
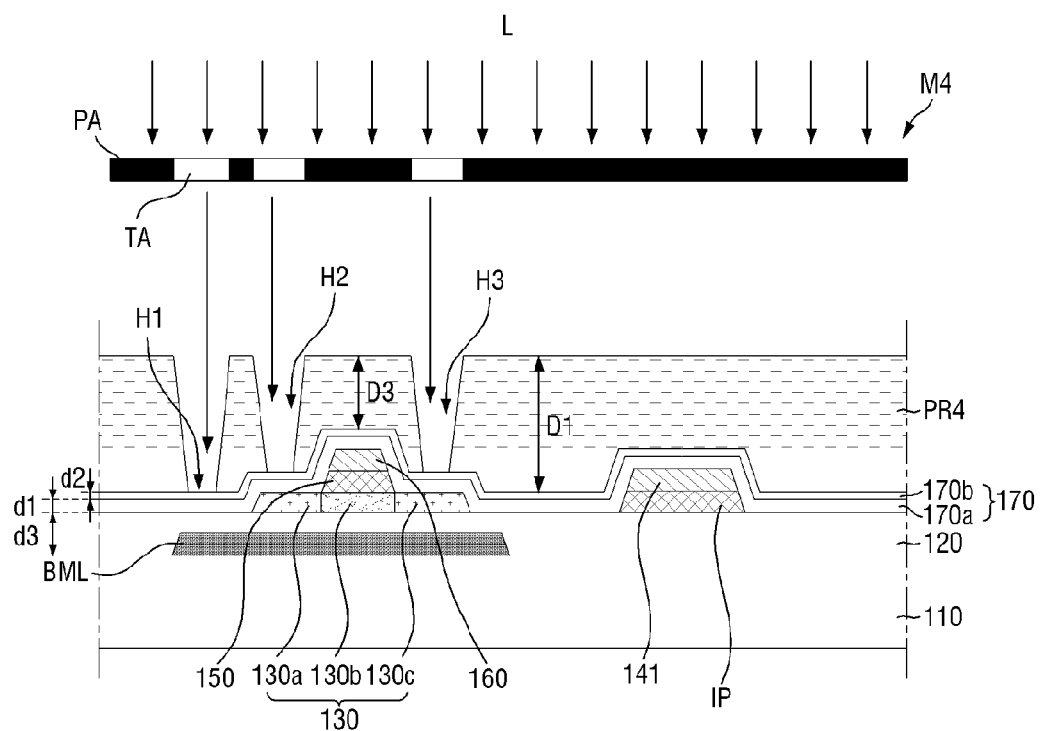

[Fig. 31]
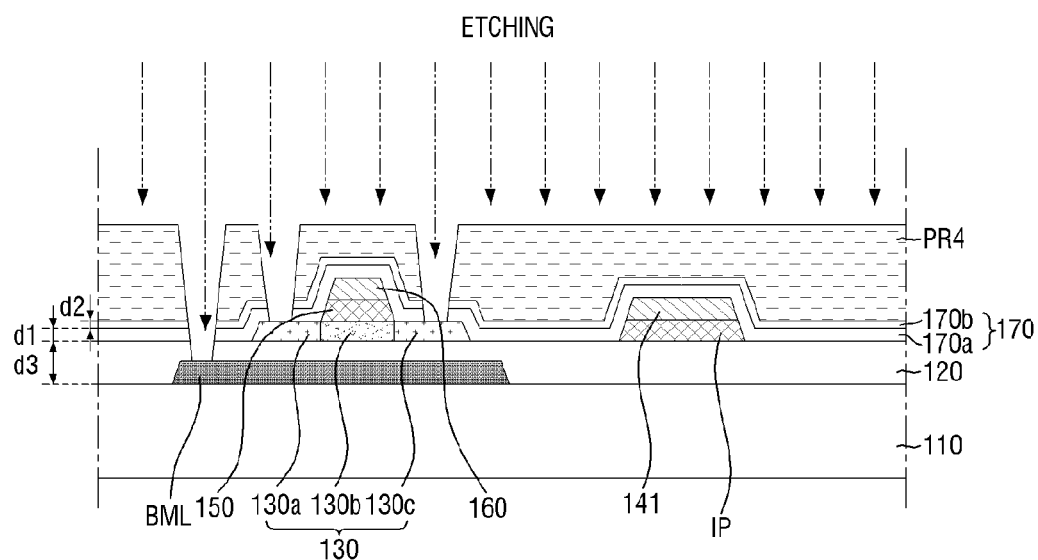
[Fig. 32]
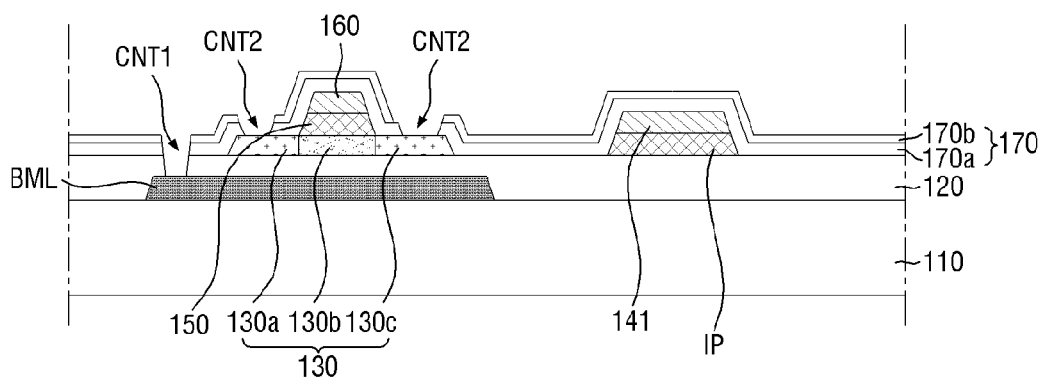

METHOD OF MANUFACTURING ORGANIC LIGHT-EMITTING DISPLAY DEVICE

CROSS-REFERENCE TO RELATED APPLICATIONS

This application is a U.S. National Phase Patent Application of International Application Number PCT/KR2018/016441, filed on Dec. 21, 2018, which claims priority to Korean Patent Application Number 10-2018-0072844, filed on Jun. 25, 2018, the entire content of each of which is incorporated herein by reference.

BACKGROUND

1. Field

The present invention relates to a method of manufacturing an organic light-emitting display device.

2. Description of Related Art

An organic light-emitting display device is a self-light-emitting type of display device that electrically excites an organic compound therein to emit light. Since the organic light-emitting display device is operable at a low voltage, can be efficiently provided in a thin profile, and can have wide viewing angles and fast response speeds, the organic light-emitting display device has been spotlighted as a next-generation display device.

The organic light-emitting display device includes an organic light-emitting layer between an anode electrode and a cathode electrode. Holes from the anode electrode and electrons from the cathode electrode are combined in the organic light-emitting layer to generate excitons, which are hole-electron pairs, and light is emitted by the energy generated when the excitons return to their ground state.

Generally, the organic light-emitting device is classified, depending on a surface from which light is emitted, into a bottom emission type in which an image is realized in a direction toward a substrate where organic light-emitting elements are formed or a top emission type in which an image is realized in a direction opposite to the substrate.

SUMMARY

The manufacture of an organic light-emitting display device involves multiple photolithography processes. A photolithography process, which is a process of forming desired patterns by transferring patterns drawn on a mask to a substrate with a thin film deposited thereon, consists of multiple procedures such as the application of a sensitizing solution and exposure and development procedures.

Masks designed to form patterns are highly expensive. Thus, as the number of masks used increases, the manufacturing cost of an organic light-emitting display device increases, and at the same time, the production yield of an organic light-emitting display device decreases.

It is an object of the present invention to provide a method of manufacturing an organic light-emitting display device, which is capable of reducing the number of masks used.

The present invention is not limited to the aforementioned technical problems, and other technical problems not mentioned can be clearly understood by those skilled in the art from the following description.

According to an aspect of the present invention, a method of manufacturing an organic light-emitting display device includes: forming a lower electrode pattern on a substrate, which includes a transistor area and a capacitor area, to correspond to the transistor area and forming a buffer layer on the substrate including the lower electrode pattern; forming a thin-film transistor including an oxide semiconductor layer on the buffer layer; forming an interlayer insulating film on the thin-film transistor; forming a photoresist film pattern including first and second holes, which have different depths, on the interlayer insulating film; and forming a first contact hole, which exposes the lower electrode pattern, and second contact holes, which expose the oxide semiconductor layer, at the same time using the photoresist film pattern.

The oxide semiconductor layer may include a source region, a channel region, and a drain region, and the second contact holes may expose the source and drain regions.

The interlayer insulating film may include a second interlayer insulating film disposed on the buffer layer and a first interlayer insulating film disposed between the second interlayer insulating film and the buffer layer, and the first interlayer insulating film may be thicker than the second interlayer insulating film.

The photoresist film pattern may be formed using a halftone mask including a light-transmitting portion, a light-blocking portion, and a semi-light-transmitting portion, and the forming the photoresist film pattern, may further include forming the first hole to correspond to the light-transmitting portion and forming the second hole to correspond to the semi-light-transmitting portion.

The first hole may correspond to the first contact hole to expose the second interlayer insulating film, and the second hole may correspond to the second contact holes to expose residual photoresist.

A thickness of the residual photoresist may be greater than a thickness of the buffer layer.

An etching rate of the second interlayer insulating film may be greater than etching rates of the first interlayer insulating film and the buffer layer.

The first interlayer insulating film and the buffer layer may have the same etching rate.

An etching rate of the residual photoresist may be greater than an etching rate of the buffer layer.

The forming the first contact hole and the second contact holes, may include using a mixed gas of $NF_3$ and $O_2$ to etch the first and second interlayer insulating films and the buffer layer to correspond to the first contact hole and to etch the residual photoresist and the first and second interlayer insulating films to correspond to the second contact holes.

The etching rates of the first interlayer insulating film and the buffer layer may be 2185 Å/min, and the etching rate of the residual photoresist may be 3825 Å/min.

The oxide semiconductor layer may be formed of IGZO, and an etching rate of the oxide semiconductor layer may be 190 Å/min.

A source electrode and the lower electrode pattern may be electrically connected through the first contact hole, and the source electrode and the source region of the oxide semiconductor layer may be electrically connected through a second contact hole formed in the source region.

According to another aspect of the present invention, a method of manufacturing an organic light-emitting display device includes: forming a lower electrode pattern on a substrate, which includes a transistor area and a capacitor area, to correspond to the transistor area and forming a buffer layer on the substrate including the lower electrode pattern; forming a thin-film transistor including an oxide semiconductor layer on the buffer layer; forming an interlayer insulating film on the thin-film transistor, forming a photoresist film pattern including first and second holes, which expose the interlayer insulating film, on the interlayer insulating film using a mask; and forming a first contact hole, which exposes the lower electrode pattern, and second contact holes, which expose the oxide semiconductor layer, at the same time using the photoresist film pattern.

The first hole may correspond to the first contact hole to expose the interlayer insulating film, and the second hole may correspond to the second contact hole to expose the interlayer insulating film.

The oxide semiconductor layer may include a source region, a channel region, and a drain region, and the second contact holes may expose the source and drain regions.

The interlayer insulating film and the buffer layer may be formed of SiOx, the oxide semiconductor layer may be formed of IGZO, and the method may further include performing etching using a mixed gas having a SiOx/IGZO etching selectivity greater than 40.

The mixed gas may be a mixed gas of $C_4F_8$ and Ar.

The mixed gas may be a mixed gas of $CHF_3$ and Ar.

A source electrode and the lower electrode pattern may be electrically connected through the first contact hole, and the source electrode and the source region of the oxide semiconductor layer may be electrically connected through a second contact hole formed in the source region.

According to another aspect of the present invention, a method of manufacturing an organic light-emitting display device includes: preparing a substrate on which a first pattern, a first insulating layer covering the first pattern, a second pattern on the first insulating layer, and a second insulating layer on the second pattern are sequentially disposed; forming a mask pattern including first and second holes, which have different depths, on the second insulating layer; and forming a first contact hole, which exposes the first pattern, and second contact holes, which expose the second pattern, by etching an underlying structure of the first hole of the mask pattern and an underlying structure of the second hole of the mask pattern.

The first pattern may be a lower electrode pattern, and the second pattern may be an oxide semiconductor layer.

The mask pattern may be a photoresist film pattern formed using a halftone mask including a light-transmitting portion, a light-blocking portion, and a semi-light-transmitting portion, and the photoresist film pattern may further include forming the first hole to correspond to the light-transmitting portion and forming the second hole to correspond to the semi-light-transmitting portion.

Advantageous Effects

The method of manufacturing an organic light-emitting display device according to an exemplary embodiment of the present invention can reduce the number of masks used. Accordingly, the manufacturing cost of an organic light-emitting display device can be reduced, and at the same time, productivity can be enhanced in accordance with process simplification.

The advantageous effects of the exemplary embodiments of the present invention are not limited to those set forth above, and various other effects are also listed in the specification.

DESCRIPTION OF DRAWINGS

FIG. 1 is a cross-sectional view of an organic light-emitting display device according to an exemplary embodiment of the present invention.

FIGS. 2 through 28 are schematic cross-sectional views illustrating a method of manufacturing an organic light-emitting display device according to an exemplary embodiment of the present invention.

FIGS. 29 through 32 are schematic cross-sectional views illustrating a method of manufacturing an organic light-emitting display device according to another exemplary embodiment of the present invention.

BEST MODE

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention will only be defined by the appended claims.

It will be understood that when an element or layer is referred to as being "on" another element or layer, it can be directly on the other element or layer or intervening elements or layers may be present. Like reference numerals refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Exemplary embodiments of the present invention will hereinafter be described with reference to the accompanying drawings. FIG. 1 is a cross-sectional view of an organic light-emitting display device according to an exemplary embodiment of the present invention.

Referring to FIG. 1, an organic light-emitting display device 100 may include a buffer layer 120 disposed on a substrate 110, a thin-film transistor (TFT) TR disposed on the buffer layer 120, a lower electrode pattern BML formed below the buffer layer 120 to correspond to the TFT TR, and a pixel electrode 181 disposed above the TFT TR.

The substrate 110 may be appropriately selected from among a transparent substrate, such as a glass substrate, a quartz substrate, a ceramic substrate, a silicon substrate, and a flexible substrate, such as a plastic substrate, as necessary.

The substrate 110 may include a TFT area TRA in which the TFT TR is formed and a capacitor area SA in which a capacitor is formed.

The lower electrode pattern BML is disposed on the substrate 110. The lower electrode pattern BML may be disposed on the TFT area TRA of the substrate 110. The lower electrode pattern BML may be disposed to overlap with a semiconductor layer 130 of the TFT TR to prevent light from being incident upon the semiconductor layer 130. Also, the lower electrode pattern BML may be electrically connected to a first electrode 191 of the TFT TR and may thus receive a corresponding voltage, thereby preventing the TFT TR from being affected by neighboring electrodes.

The lower electrode pattern BML may be formed of at least one selected from among Ag, Mg, Al, Pt, Pd, Au, Ni, Nd, Ir, Cr, Li, Ca, Mo, Ti, W, MoW, and Cu, but the present invention is not limited thereto.

The buffer layer 120 may be disposed on the substrate 110 where the lower electrode pattern BML is disposed. The buffer layer 120 may be disposed on the entire surface of the substrate 110 to cover the lower electrode pattern BML. The buffer layer 120 may protect the TFT TR, formed in a subsequent process, against impurities such as alkali ions that may be released from the substrate 110 and may planarize the surface of the substrate 110.

The TFT TR may be disposed on the buffer layer 120 in the TFT area TRA. The TFT TR may include the semiconductor layer 130, a gate insulating film 150, and a gate electrode 160, which are sequentially deposited on the buffer layer 120, and may further include the first electrode 191 and a second electrode 192, which are connected to the semiconductor layer 130. One of the first and second electrodes 191 and 192 may be a source electrode, and the other electrode may be a drain electrode.

The semiconductor layer 130 may include an oxide semiconductor. The semiconductor layer 130 may include, for example, one compound selected from among indium gallium zinc oxide (IGZO), indium zinc oxide (a-IZO), indium tin zinc oxide (ITZO), and indium gallium oxide (IGO), but the present invention is not limited thereto.

The semiconductor layer 1130 can be formed at a relatively low temperature and can be formed as a thin film on a substrate such as a plastic plate or a film. Also, the electron mobility speed of the semiconductor layer 130 is 10 times faster than that of amorphous silicon, and thus, the semiconductor layer 130 is suitable for high-resolution driving at a recent ultra-definition (UD) resolution or for high-speed driving at a speed of 240 Hz or higher.

The semiconductor layer 130 may include a channel region 130b and first and second regions 130a and 130c disposed on both sides of the channel region 130b. The channel region 130b may overlap with the gate electrode 160. The first region 130a may be electrically connected to the first electrode 191, and the second region 130c may be electrically connected to the second electrode 192. The first region 130a may be a first source/drain region, and the second region 130c may be a second source/drain region. In a case where the first electrode 191 is a source electrode and the second electrode 192 is a drain electrode, the first region 130a may become a source region, and the second region 130c may become a drain region. The first and second regions 130a and 130c may be metalized by a metallization process, but the present invention is not limited thereto.

The gate insulating film 150 may be formed on the semiconductor layer 130. The width of the gate insulating film 150 may be substantially the same as, or smaller than, the width of the channel region 130b of the semiconductor layer 130, or may be substantially the same as, or greater than, the width of the gate electrode 160. By controlling the gate insulating film 150, the metallization of the semiconductor layer 130 can be performed using the gate insulating film 150 without a requirement of additional mask processes.

The gate insulating film 150 may be formed of silicon oxide ($SiO_2$), silicon nitride (SiNx), or silicon oxynitride (SiON), but the present invention is not limited thereto.

The gate electrode 160 may be disposed on the gate insulating film 150 to have substantially the same width as, or a smaller width than, the gate insulating film 150. The gate electrode 160 may overlap with the channel region 130b of the semiconductor layer 130. The gate electrode 160 may be formed as a single-layer film using at least one selected from the group consisting of molybdenum (Mo), tungsten (W), aluminum neodymium (AlNd), titanium (Ti), aluminum (Al), silver (Ag), and an alloy thereof alone or in a mixture or may be formed as a double- or multilayer film using a low resistance material such as Mo, Al, or Ag to reduce the resistance of wiring. That is, in order to reduce the resistance of wiring, the gate electrode 160 may be formed by sequentially depositing multilayer conductive films. Specifically, the gate electrode 160 may have a multilayer structure consisting of Mo/Al/Mo, MoW/AlNd/MoW, Mo/Ag/Mo, Mo/Ag alloy/Mo, or Ti/Al/Mo.

An insulating pattern IP, which is formed of the same material as the gate insulating film 150, may be disposed on the buffer layer 120 in the capacitor area SA, and a first capacitor electrode 141, which is formed of the same material as the gate electrode 160, may be disposed on the insulating pattern IP.

An interlayer insulating film 170 may be disposed on the entire surface of the substrate 110 where the gate electrode 160 and the first capacitor electrode 141 are formed.

The interlayer insulating film 170 may be formed on the entire surface of the substrate 110 to have a predetermined thickness and thus to cover the gate electrode 160 and the first capacitor electrode 141. The interlayer insulating film 170 may insulate the gate electrode 160 from the first and second electrodes 191 and 192 and may be disposed between a second capacitor electrode 142 and the first capacitor electrode 141 to serve as a dielectric film.

The interlayer insulating film 170 may be formed as a multilayer film having two or more layers. The interlayer insulating film 170 will hereinafter be described as being, for example, a double-layer film consisting of first and second interlayer insulating films 171 and 172.

The first and second interlayer insulating films 170a and 170b may be formed as inorganic insulating films. For example, the first and second interlayer insulating films 170a and 170b may be formed of $SiO_2$, SiNx, SiON, $Al_2O_3$, TiO2, $Ta_2O_5$, $HfO_2$, $ZrO_2$, BST, or PZT, but the present invention is not limited thereto.

The first and second interlayer insulating films 170a and 170b may be formed of the same material or may include different materials. The first interlayer insulating film 170a will hereinafter be described as being formed of, for example, silicon oxide ($SiO_2$) and the second interlayer insulating film 170b will hereinafter be described as being formed of, for example, silicon nitride (SiNx).

The first and second electrodes 191 and 192 of the TFT TR may be disposed on the interlayer insulating film 170 in the TFT area TRA, and the second capacitor electrode 142, which is formed of the same material as the first and second electrodes 191 and 192, may be disposed on the interlayer insulating film 170 in the capacitor area CA.

The first and second electrodes 191 and 192 and the second capacitor electrode 142 may be formed as single-layer films or as double- or multilayer films using at least one selected from the group consisting of aluminum, titanium, neodymium, aluminum, silver, molybdenum, tungsten, molybdenum, tungsten, and an alloy thereof alone or in a mixture. For example, the first and second electrodes 191 and 192 and the second capacitor electrode 142 may have a stack structure of Ti/Al/Ti, Mo/Al/Mo, MoW/AlNd/MoW, Mo/Ag/Mo, Mo/Ag alloy/Mo, or Ti/Al/Mo.

As already mentioned above, the first and second electrodes 191 and 192 are electrically connected to the first and second regions 130a and 130c of the semiconductor layer 130. That is, the interlayer insulating film 170 may include second contact holes CNT2, which are formed to correspond to the first and second regions 130a and 130c, and the first and second electrodes 191 and 192 may be connected to the first and second regions 130a and 130c, respectively, of the semiconductor layer 130 through the second contact holes CNT2.

One of the first and second electrodes 191 and 192 may be connected to the lower electrode pattern BML, which is disposed below the buffer layer 120. That is, the interlayer insulating film 170 and the buffer layer 120 may include a first contact hole CNT1, which exposes the lower electrode pattern BLM, and one of the first and second electrodes 191 and 192 may be connected to the lower electrode pattern BML through the first contact hole CNT1 and may thus prevent the lower electrode patterns BML from affecting other electrodes. For example, in a case where the first electrode 191 is connected to the lower electrode pattern BML through the first contact hole CNT1, the first electrode 191 may be connected to the first region 130a through one of the second contact holes CNT2.

A passivation layer PAS may be disposed on the interlayer insulating film 170. The passivation layer PAS may include first and second passivation layers PAS1 and PAS2, which are sequentially stacked.

The first and second passivation layers PAS1 and PAS2 may be formed as organic films or inorganic films. For example, in a case where the first passivation layer PAS1 is formed as an inorganic film and the second passivation layer PAS2 is formed as an organic film, the first passivation layer PAS1 may be formed as an inorganic film including $SiO_2$, SiNx, SiON, $Al_2O_3$, $TiO_2$, $Ta_2O_5$, $HfO_2$, $ZrO_2$, BST, or PZT, and the second passivation layer PAS2 may be formed as an organic film including a general-purpose polymer (PMMA or PS), a polymer derivative having a phenol group, an acrylic polymer, an imide polymer, an aryl ether polymer, an amide polymer, a fluorine polymer, a p-xylene polymer, a vinyl alcohol polymer, or a blend thereof. However, the present invention is not limited to this example.

The passivation layer PAS may planarize the top of the interlayer insulating film 170, and the pixel electrode 181 may be disposed on the passivation layer PAS. The pixel electrode 181 may have a stack of a layer of a high-work function material such as indium tin oxide (ITO), indium zinc oxide (IZO), zinc oxide (ZnO), or indium oxide ($In_2O_3$) and a layer of a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof. The pixel electrode 181 may have a multilayer structure of ITO/Mg, ITO/MgF, ITO/Ag, or ITO/Ag/ITO, but the present invention is not limited thereto.

The pixel electrode 181 may be an anode electrode that is the hole injection electrode of a light-emitting diode.

The pixel electrode 181 may be connected to one of the first and second electrodes 191 and 192. For example, in a case where the pixel electrode 181 is connected to the first electrode 191, the first and second passivation layers PAS1 and PAS2 may include a third contact hole CNT3, and the pixel electrode 181 and the first electrode 191 may be connected through the third contact hole CNT3.

A pixel-defining layer 182, which exposes the pixel electrode 181, may be disposed on the passivation layer PAS. That is, the pixel-defining layer 182 may be disposed on the passivation layer PAS to surround the edges of the pixel electrode 181. The pixel-defining layer 182 may be formed using at least one selected from the group consisting of a polyacrylic resin, an epoxy resin, a phenol resin, a polyamide resin, a polyimide resin, an unsaturated polyester resin, a polyphenylene resin, a polyphenylene sulfide resin, and benzocyclobutene alone or in a mixture.

Although not specifically illustrated, an organic light-emitting layer (not illustrated) and a cathode electrode (not illustrated), which is an electron injection electrode and a common electrode, may be disposed on the pixel electrode 181 exposed by the pixel-defining layer 182. Accordingly, holes and electrons may be injected into the organic light-emitting layer, and as excitons generated by combining the holes and the electros fall from an excited state to a ground state, light is emitted.

A method of manufacturing the aforementioned organic light-emitting display device will hereinafter be described.

FIGS. 2 through 28 are schematic cross-sectional views illustrating a method of manufacturing an organic light-emitting display device according to an exemplary embodiment of the present invention. Like reference numerals indicate like elements throughout the accompanying drawings, and detailed descriptions thereof will be omitted.

Referring to FIG. 2, a lower electrode pattern material layer BMLL is formed on a substrate 110, and a first photoresist film pattern PR1 is formed using a first mask M1.

For convenience, a photoresist film will hereinafter be described as being, for example, a positive photoresist film, but the present invention is not limited thereto. Alternatively, a negative photoresist film may be used as a photoresist film.

The first mask M1 may include light-transmitting portions TA and a light-blocking portion PA. The light-transmitting portions TA may allow the transmission of light applied thereto, and the light-blocking portion PA may block the transmission of light applied thereto. The light-blocking portion PA of the first mask MA1 may be placed to correspond to an area in which to form a lower electrode pattern BML. Thereafter, a photoresist film is irradiated with light using the first mask MA1 and is then developed. Then, parts of the photoresist film corresponding to the light-transmitting portions TA are removed, and a part of the photoresist film corresponding to the light-blocking portion PA remains unremoved. As a result, the first photoresist film pattern PR1 is formed.

Referring to FIGS. 3 and 4, the lower electrode pattern material layer BMLL is etched using the first photoresist film pattern PR1 as an etching mask, and the first photoresist film pattern PR1 is removed, thereby forming the lower electrode pattern BML. The first photoresist film pattern PR1 may be removed by an ashing process using oxygen, but the present invention is not limited thereto.

Referring to FIG. 5, a buffer layer 120 is formed on the substrate 110 where the lower electrode pattern BML is formed.

The buffer layer 120 may be formed by chemical vapor deposition or plasma-enhanced chemical vapor deposition. The buffer layer 120 may be formed of silicon oxide ($SiO_2$), but the present invention is not limited thereto.

Referring to FIG. 6, a semiconductor material layer 130L is formed on the buffer layer 120.

The semiconductor material layer 130L may be formed by a vapor deposition method and a photolithography method. For example, the semiconductor material layer 130L may be formed of IGZO or the like using the vapor deposition method, particularly, sputtering or pulse laser deposition (PLD), but the present invention is not limited thereto.

Referring to FIG. 7, a second photoresist film pattern PR2 is formed using a second mask M2. The second mask M2 may include light-transmitting portions TA and a light-blocking portion PA, and the light-blocking portion PA of the second mask MA2 may correspond to an area in which to form a semiconductor layer 130. Thereafter, a photoresist film is irradiated with light using the second mask MA2 and is then developed. Then, parts of the photoresist film corresponding to the light-transmitting portions TA are removed, and a part of the photoresist film corresponding to the light-blocking portion PA remains unremoved. As a result, the second photoresist film pattern PR2 is formed.

Referring to FIGS. 8 and 9, the semiconductor material layer 130 is etched using the second photoresist film pattern PR2 as an etching mask, and the second photoresist film pattern PR2 is removed, thereby forming the semiconductor layer 130.

Referring to FIG. 10, a first insulating material layer IML1 is formed on the buffer layer 120 where the semiconductor layer 130 is formed. The first insulating material layer IML1 may be formed by chemical vapor deposition using an inorganic material such as SiNx, $SiO_2$, or SiON, but the present invention is not limited thereto. Alternatively, the first insulating material layer IML1 may be formed of a complex of an inorganic material and an organic material.

Referring to FIG. 11, a first metal material layer ML1 is formed on the first insulating material layer IML1 using sputtering or the like.

Referring to FIG. 12, third photoresist film patterns PR3 are formed using a third mask M3. The third mask M3 may include light-transmitting portions TA and light-blocking portions PA, and the light-blocking portion PA of the third mask MA3 may correspond to areas in which to form a gate electrode 160 and a first capacitor electrode 141. Thereafter, a photoresist film is irradiated with light using the second mask MA3 and is then developed. Then, parts of the photoresist film corresponding to the light-transmitting portions TA are removed, and parts of the photoresist film corresponding to the light-blocking portions PA remain unremoved. As a result, the third photoresist film patterns PR3 are formed.

Referring to FIGS. 13 and 14, the first metal material layer ML1 and the first insulating material layer IML1 are etched using the third photoresist film patterns PR3 as an etching mask, and the third photoresist film patterns PR3 are removed, thereby forming a gate insulating film 150, forming a gate electrode 160 and an insulating pattern IP on the gate insulating film 150, and forming the first capacitor electrode 141 on the insulating pattern IP.

Referring to FIG. 15, the semiconductor layer 130 is metalized using the gate insulating film 150 as a mask, thereby forming first and second regions 130a and 130c of the semiconductor layer 130. The first region 130a will hereinafter be described as being, for example, a source region, and the second region 130c will hereinafter be described as being, for example, a drain region. Accordingly, the semiconductor layer 130 may be divided into the source region 130a, a channel region 130b, and the drain region 130c.

Referring to FIG. 16, first and second interlayer insulating films 170a and 170b may be sequentially formed on the buffer layer 120 where the gate electrode 160 and the first capacitor electrode 141 are formed. Specifically, the thickness of the first interlayer insulating film 170a may be greater than the thickness of the second interlayer insulating film 170b. For example, a thickness d1 of the first interlayer insulating film 170a may be 3000 Å, and a thickness d2 of the second interlayer insulating film 170b may be 2000 Å.

The first and second interlayer insulating films 170a and 170a may be formed of a material such that with respect to a mixed gas used in etching, the etching rate of the first interlayer insulating film 170a can be less than the etching rate of the second interlayer insulating film 170b.

The first and second interlayer insulating films 170a and 170b may be formed as inorganic insulating films. For example, the first and second interlayer insulating films 170a and 170b may be formed of $SiO_2$, SiNx, SiON, $Al_2O_3$, TiO2, $Ta_2O_5$, $HfO_2$, $ZrO_2$, BST, or PZT, but the present invention is not limited thereto.

There are various factors that cause operation instability of an oxide semiconductor, and among them, the characteristics of the first interlayer insulating film 170a are important. Since the electrical characteristics of an oxide semiconductor considerably vary depending on the doping degree of hydrogen (H), which is a shallow donor, the characteristics of an oxide semiconductor may change depending on the amount of hydrogen contained in the first interlayer insulating film 170a. Generally, silicon nitride (SiNx) contains more hydrogen than silicon oxide ($SiO_2$). Bias stress characteristics are poorer when silicon nitride (SiNx) is used as an insulating film than when silicon oxide ($SiO_2$) is used as an insulating film, and this is believed to be associated with hydrogen present in the interface. Therefore, the first interlayer insulating film 170a may preferably be formed of silicon oxide ($SiO_2$), and the second interlayer insulating film 170b may preferably be formed of silicon nitride (SiNx).

Referring to FIGS. 17 and 18, a photoresist film material layer PRL is applied on the second interlayer insulating film 170b, and a fourth photoresist film pattern PR4 is formed using a fourth mask M4.

The fourth mask M4 may be a halftone mask or a slit mask and may include a light-transmitting portion TA transmitting light therethrough, light-blocking portions PA blocking the transmission of light, and semi-light-transmitting portions HA partially transmitting light therethrough. The fourth mask MA4 is placed such that the light-transmitting portion TA can correspond to an area in which to form a first contact hole CNT1, and that semi-light-transmitting portions HA can correspond to areas in which to form second contact holes CNT2, and a photoresist film is irradiated with light (exposure) using the fourth mask MA4 and is then developed. Then, a portion of the photoresist film corresponding to the light-transmitting portion TA and portions of the photoresist film corresponding to the semi-light-transmitting portions HA are removed to different thicknesses, and portions of the photoresist film corresponding to the light-blocking portions PA remain unremoved.

Specifically, a first hole H1 is formed in an area corresponding to the light-transmitting portion TA, and second and third holes H2 and H3, which are shallower than the first hole H1, are formed in areas corresponding to the semi-light-transmitting portions HA. That is, in the fourth photoresist film pattern PR4, the first hole H1, which exposes a part of the second interlayer insulating film 170b, may be formed to correspond to the area in which to form the first contact hole CNT1, and the second and third holes H2 and H3, in which residual photoresist RP is disposed on the second interlayer insulating film 170b, are formed to correspond to the areas in which to form the second contact holes CNT2, may be formed.

In one exemplary embodiment, a thickness D1 of portions of the fourth photoresist film pattern PR4 corresponding to the light-blocking portions PA may be 24000 Å, a thickness D2 of the residual photoresist RP may be 7000 Å, the depth of the first hole H1 may be 24000 Å, the depths of the second and third holes H2 and H3 may be 17000 Å and a thickness D3 of a portion of the fourth photoresist film pattern PR4 formed on a part of the second interlayer insulating film 170b corresponding to the gate 160 may be 17000 Å. However, the present invention is not limited to this exemplary embodiment. The thicknesses D1, D2, and D3 and the depths of the first, second, and third holes H1, H2, and H3 may vary depending on the materials and thicknesses of the first and second interlayer insulating films 170a 170b, the mixed gas used in etching, and the like.

Referring to FIGS. 19 and 20, the resulting structure is etched. That is, dry etching may be performed on the structure in which the fourth photoresist film pattern PR4 is formed. This step not only involves etching parts exposed by the fourth photoresist film pattern PR4, but also involves etching the fourth photoresist film pattern PR4. Specifically, while parts of the second interlayer insulating film 170b, the first interlayer insulating film 170a, and the buffer layer 120 exposed by the first hole are being etched by an etching gas, the residual photoresist RP and parts of the second interlayer insulating film 170b and the first interlayer insulating film 170a exposed by the second hole H2 may also be etched. The residual photoresist RP may delay the exposure of an oxide semiconductor layer while the first contact hole CNT1 is being formed.

Thereafter, by removing parts of the fourth photoresist film pattern PR4 that remain unremoved, the first contact hole CNT1 may be formed to expose the lower electrode pattern BML, and the second contact holes CNT2 may be formed to expose the source and drain regions 130a and 130c.

The thickness d1 of the first interlayer insulating film 170a may be greater than the thickness d2 of the second interlayer insulating film 170b, and the thickness d3 of the buffer layer 120 may be smaller than the thickness D2 of the residual photoresist RP. In one exemplary embodiment, when the thickness D2 of the residual photoresist RP is 7000 Å, the thickness d3 of the buffer layer 120 may be 7000 Å or less.

With respect to the mixed gas used in etching, the etching rate of the second interlayer insulating film 170b may be greater than the etching rates of the first interlayer insulating film 170a and the buffer layer 120.

The etching rate of the first interlayer insulating film 170a may be the same as the etching rate of the buffer layer 120.

The etching rate of the residual photoresist RP may be less than the etching rate of the second interlayer insulating film 170b and may be greater than the etching rates of the first interlayer insulating film 170a and the buffer layer 120.

In one exemplary embodiment, the second interlayer insulating film 170b may be formed of silicon nitride (SiNx), the first interlayer insulating film 170a and the buffer layer 120 may be formed of silicon oxide ($SiO_2$), the source and drain regions 130a and 130b may be formed of IGZO. In one exemplary embodiment, in a case where etching is performed using a mixed gas of nitrogen trifluoride ($NF_3$) and oxygen ($O_2$), the etching rate of the second interlayer insulating film 170b may be 4425 Å/min, the g rates of the first interlayer insulating film 170a the buffer layer 120 may be 2185 Å/min, the rate of the residual photoresist RP may be 3825 Å/min, and the rate of the IGZO forming the source and regions 130a 130b may be 190 Å/min.

Thus, in the case of forming the first contact hole CNT1 and the second contact holes CNT2 using a single mask, the residual photoresist RP and the first and second interlayer insulating films 170a and 170b are etched from the areas in which to form the second contact holes CNT2, while the first and second interlayer insulating films 170a and 170b and the buffer layer 120 are being etched to form the first contact hole CNT1. Accordingly, the source and drain regions 130a and 130c, which are formed of IGZO, can be prevented from being damaged during the formation of the second contact holes CNT2. As a result, the first contact hole CNT1, which exposes the lower electrode pattern BML, and the second contact holes CNT2, which expose the source and drain regions 130a and 130b, can be formed to different depths by using a single mask.

That is, according to the present exemplary embodiment, the first contact hole CNT1, which is connected to the lower electrode pattern BML, and the second contact holes CNT2, which expose the source and drain regions 130a and 130b, can be formed using a single mask process, instead of separate mask processes. Thus, manufacturing cost can be reduced, and productivity can be improved.

Referring to FIGS. 21 and 22, first and second electrodes 191 and 192 and a second capacitor electrode 142 are formed by forming a second metal material layer ML2 on the second interlayer insulating film 170b where the first contact hole CNT1 and the second contact holes CNT2 are formed and then patterning the second metal material layer ML2. The first electrode 191 will hereinafter be described as being, for example, a source electrode, and the second electrode 192 will hereinafter be described as being, for example, a drain electrode.

Specifically, the second metal material layer ML2 may be formed, through sputtering or the like, on the second interlayer insulating film 170b where the first contact hole CNT1 and the second contact holes CNT2 are formed, photoresist film patterns may be formed by placing light-blocking portions PA of a mask to correspond to areas in which to form the source and drain electrodes 191 and 192 and the second capacitor electrode 142 and applying light using the mask, and the source and drain electrodes 191 and 192 and the second capacitor electrode 142 may be formed by etching the second metal material layer ML2 using the photoresist film patterns as an etching mask.

Referring to FIGS. 23 and 24, a passivation layer PAS may be formed on the second interlayer insulating film 170b where the source and drain electrodes 191 and 192 and the second capacitor electrode 142 are formed.

The passivation layer PAS may include first and second passivation layers PAS1 and PAS2.

Referring to FIG. 25, a third contact hole CNT3 may be formed on the first and second passivation layers PAS1 and PAS2 to expose the source electrode 191. Specifically, a photoresist film pattern may be formed by placing a light-transmitting portion TA of a mask MA4 to correspond to an area in which to form the third contact hole CNT3 and applying light, and the third contact hole CNT3 may be formed by etching the first and second passivation layers PAS1 and PAS2 using the photoresist film pattern as an etching mask.

Referring to FIGS. 26 and 27, a pixel electrode 181 may be disposed on the passivation layer PAS where the third contact hole CNT3 is formed. Specifically, a photoresist film pattern may be formed by placing a light-blocking portion PA of a mask to correspond to an area in which to form the pixel electrode 181 and applying light using the mask, and the pixel electrode 181, which is connected to the source electrode 191 through the third contact hole CNT3, may be formed by etching the third metal material layer ML3 using the photoresist film pattern as an etching mask.

Referring to FIG. 28, a pixel-defining layer 182, which exposes the pixel electrode 181, is formed by depositing an organic film for a pixel-defining layer on the passivation layer PAS and the pixel electrode 181 and patterning the organic film. Specifically, the organic film for a pixel-defining layer may be deposited via chemical vapor deposition, a photoresist film pattern may be formed by placing a light-blocking portion PA of a mask to correspond to an area in which to form the pixel-defining layer 182 and applying light using the mask, and the pixel-defining layer 182, which exposes the pixel electrode 181, may be formed by etching the organic film for a pixel-defining layer using the photoresist film pattern as an etching mask.

Referring to FIG. 29, steps performed until a photoresist film material layer PRL on a second interlayer insulating film 170b are substantially the same as their respective counterparts of the exemplary embodiment of FIGS. 2 through 17.

Referring to FIG. 30, a photoresist film material layer PRL is applied on a second interlayer insulating film 170b, and a fourth photoresist film pattern PR4 is formed using a fourth mask M4.

The fourth mask M4 may include light-transmitting portions TA transmitting light therethrough and light-blocking portions PA blocking the transmission of light. The fourth mask MA4 is placed such that the light-transmitting portions TA can correspond to areas in which to form a first contact hole CNT1 and second contact holes CNT2, and a photoresist film is irradiated with light (exposure) using the fourth mask MA4 and is then developed. Then, portions of the photoresist film corresponding to the light-transmitting portions TA are removed, and portions of the photoresist film corresponding to the light-blocking portions PA remain unremoved.

Specifically, first, second, and third holes H1, H2, and H3 are formed in areas corresponding to the light-transmitting portions TA. In the present exemplary embodiment, unlike in the previous exemplary embodiment, the first, second, and third holes H1, H2, and H3 expose the second interlayer insulating film 170b without any residual photoresist (RP of FIG. 18) present therein.

In one exemplary embodiment, the thickness of the fourth photoresist film pattern PR4 on a part of the second interlayer insulating film 170b corresponding to a gate electrode 160 may be 17000 Å, but present invention is not limited thereto. The thickness of the fourth photoresist film pattern PR4 on the part of the second interlayer insulating film 170b corresponding to the gate electrode 160 may vary depending on the materials and thicknesses of a first interlayer insulating film 170a, the second interlayer insulating film 170b, and a buffer layer 120, a mixed gas used in etching, and the like.

Referring to FIGS. 30 and 31, the first contact hole CNT1, which exposes a lower electrode pattern BML, and the second contact holes CNT2, which expose source and drain regions 130a and 130c, may be formed by etching the second interlayer insulating film 170b, the first interlayer insulating film 170a, and the buffer layer 120 using the fourth photoresist film pattern PR4 as an etching mask and removing the fourth photoresist film pattern PR4.

A thickness d1 of the first interlayer insulating film 170a may be greater than a thickness d2 of the second interlayer insulating film 170b, and a thickness d3 of the buffer layer 120 may be smaller than a thickness D2 of residual photoresist RP. In one exemplary embodiment, when the thickness D2 of the residual photoresist RP is 7000 Å, the thickness d3 of the buffer layer 120 may be 7000 Å or less. The second interlayer insulating film 170b, the first interlayer insulating film 170a, and the buffer layer 120 may be formed of SiOx.

The mixed gas used in etching may have a SiOx/IGZO etching selectivity greater than 40 (or 40:1). For example, the mixed gas used in etching may be a mixed gas of $C_4F_8$ and Ar or a mixed gas of $CHF_3$ and Ar, but the present invention is not limited thereto.

In a case where the mixed gas used in etching is a mixed gas of $CHF_3$ and Ar, the mixed gas used in etching may have a SiOx/IGZO etching selectivity greater than 50 (or 50:1), and in a case where the mixed gas used in etching is a mixed gas of $C_4F_8$ and Ar, the mixed gas used in etching may have a SiOx/IGZO etching selectivity greater than 100 (or 100:1).

Thus, in the case of forming the first contact hole CNT1 and the second contact holes CNT2 using a single mask, the first and second interlayer insulating films 170a and 170b are etched from the areas in which to form the second contact holes CNT2, while the first and second interlayer insulating films 170a and 170b and the buffer layer 120 are being etched to form the first contact hole CNT1. Accordingly, even if the source and drain regions 130a and 130c, which are formed of IGZO, are exposed, damage to the source and drain regions 130a and 130b can be minimized. As a result, the first contact hole CNT1, which exposes the lower electrode pattern BML, and the second contact holes CNT2, which are formed to a different depth from the first contact hole CNT1 and expose the source and drain regions 130a and 130b, can be etched at the same time using a mixed gas of $C_4F_8$ and Ar or a mixed gas of $CHF_3$ and Ar.

Therefore, the first contact hole CNT1, which exposes the lower electrode pattern BML, and the second contact holes CNT2, which expose the source and drain regions 130a and 130b, can be formed using only four masks (i.e., M1, M2, M3, and M4), whereas conventionally, five masks are needed to form the first contact hole CNT1, which is connected to the lower electrode pattern BML, and the second contact holes CNT2, which expose the source and drain regions 130a and 130b. Thus, manufacturing cost can be reduced, and productivity can be improved.

Subsequent processes are substantially the same as their respective counterparts of the previous exemplary embodiment, and thus, detailed descriptions thereof will be omitted.

Although a few exemplary embodiments of the present invention have been described, those skilled in the art will readily appreciate that many modifications are possible in the exemplary embodiments without departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific exemplary embodiments disclosed.

The invention claimed is:

1. A method of manufacturing an organic light-emitting display device, the method comprising:
    forming a lower electrode pattern on a substrate, which includes a transistor area and a capacitor area, to correspond to the transistor area;
    forming a buffer layer on the substrate including the lower electrode pattern;
    forming a thin-film transistor including an oxide semiconductor layer on the buffer layer;
    forming an interlayer insulating film on the thin-film transistor;
    forming a photoresist film pattern including first and second holes, which have different depths, on the interlayer insulating film; and forming a first contact hole, which exposes the lower electrode pattern, and second contact holes, which expose the oxide semiconductor layer, at the same time using the photoresist film pattern, wherein the photoresist film pattern includes a residual photoresist disposed between the second holes and the interlayer insulating film, wherein the interlayer insulating film includes:
   a second interlayer insulating film on the buffer layer; and
   a first interlayer insulating film between the second interlayer insulating film and the buffer layer, wherein the first interlayer insulating film is thicker than the second interlayer insulating film.

2. The method of claim 1, wherein
the oxide semiconductor layer includes a source region, a channel region, and a drain region, and
the second contact holes expose the source and drain regions.

3. The method of claim 2, wherein
the photoresist film pattern is formed using a halftone mask including a light-transmitting portion, a light-blocking portion, and a semi-light-transmitting portion, and
the forming the photoresist film pattern, further comprises forming the first hole to correspond to the light-transmitting portion and forming the second hole to correspond to the semi-light-transmitting portion.

4. The method of claim 3, wherein
the first hole corresponds to the first contact hole to expose the second interlayer insulating film, and
the second hole corresponds to the second contact holes to expose the residual photoresist.

5. The method of claim 4, wherein a thickness of the residual photoresist is greater than a thickness of the buffer layer.

6. The method of claim 4, wherein an etching rate of the second interlayer insulating film is greater than etching rates of the first interlayer insulating film and the buffer layer.

7. The method of claim 4, wherein the first interlayer insulating film and the buffer layer have the same etching rate.

8. The method of claim 4, wherein an etching rate of the residual photoresist is greater than an etching rate of the buffer layer.

9. The method of claim 8, wherein the forming the first contact hole and the second contact holes, comprises using a mixed gas of $NF_3$ and $O_2$ to etch the first and second interlayer insulating films and the buffer layer to correspond to the first contact hole and to etch the residual photoresist and the first and second interlayer insulating films to correspond to the second contact holes.

10. The method of claim 9, wherein
the etching rates of the first interlayer insulating film and the buffer layer are 2185 Å/min, and
the etching rate of the residual photoresist is 3825 Å/min.

11. The method of claim 10, wherein
the oxide semiconductor layer is formed of IGZO, and
an etching rate of the oxide semiconductor layer is 190 Å/min.

12. The method of claim 11, wherein
a source electrode and the lower electrode pattern are electrically connected through the first contact hole, and the source electrode and the source region of the oxide semiconductor layer are electrically connected through a second contact hole formed in the source region.

13. A method of manufacturing an organic light-emitting display device, the method comprising:
   forming a lower electrode pattern on a substrate, which includes a transistor area and a capacitor area, to correspond to the transistor area;
   forming a buffer layer on the substrate including the lower electrode pattern;
   forming a thin-film transistor including an oxide semiconductor layer on the buffer layer;
   forming an interlayer insulating film on the thin-film transistor;
   forming a photoresist film pattern including first and second holes, which expose the interlayer insulating film, on the interlayer insulating film using a mask; and
   forming a first contact hole, which exposes the lower electrode pattern, and second contact holes, which expose the oxide semiconductor layer, at the same time using the photoresist film pattern,
wherein
the interlayer insulating film and the buffer layer are formed of SiOx,
the oxide semiconductor layer is formed of IGZO, and
the method further comprises performing etching using a mixed gas having a SiOx/IGZO etching selectivity greater than 40.

14. The method of claim 13, wherein
the first hole corresponds to the first contact hole to expose the interlayer insulating film, and
the second hole corresponds to a second contact hole from among the second contact holes to expose the interlayer insulating film.

15. The method of claim 14, wherein
the oxide semiconductor layer includes a source region, a channel region, and a drain region, and
the second contact holes expose the source and drain regions.

16. The method of claim 15, wherein the mixed gas is a mixed gas of $C_4F_8$ and Ar.

17. The method of claim 15, wherein the mixed gas is a mixed gas of $CHF_3$ and Ar.

18. The method of claim 15, wherein
a source electrode and the lower electrode pattern are electrically connected through the first contact hole, and
the source electrode and the source region of the oxide semiconductor layer are electrically connected through a second contact hole formed in the source region.

19. A method of manufacturing an organic light-emitting display device, the method comprising:
   preparing a substrate on which a first pattern, a first insulating layer covering the first pattern, a second pattern on the first insulating layer, and a second insulating layer on the second pattern are sequentially disposed;
   forming a mask pattern including first and second holes, which have different depths, on the second insulating layer;
   forming a first contact hole, which exposes the first pattern, and second contact holes, which expose the second pattern, by etching an underlying structure of the first hole of the mask pattern and an underlying structure of the second hole of the mask pattern;
   wherein the second insulating layer includes:
      a second interlayer insulating film on a buffer layer; and a first interlayer insulating film between the second interlayer insulating film and the first insulating layer, wherein the first interlayer insulating film is thicker than the second interlayer insulating film.

20. The method of claim 19, wherein the first pattern is a lower electrode pattern, and the second pattern is an oxide semiconductor layer.

21. The method of claim 20, wherein the mask pattern is a photoresist film pattern formed using a halftone mask including a light-transmitting portion, a light-blocking portion, and a semi-light-transmitting portion, and the photoresist film pattern further comprises forming the first hole to correspond to the light-transmitting portion and forming the second hole to correspond to the semi-light-transmitting portion.

* * * * *